United States Patent [19]

Snyder et al.

[11] Patent Number: 5,185,539
[45] Date of Patent: Feb. 9, 1993

[54] PROGRAMMABLE LOGIC DEVICE ADDRESS BUFFER/MULTIPLEXER/DRIVER

[75] Inventors: Janet M. Snyder; Eugene H. Gruender, Jr., both of Austin, Tex.

[73] Assignee: Motorola, Inc., Schaumburg, Ill.

[21] Appl. No.: 576,565

[22] Filed: Aug. 31, 1990

[51] Int. Cl.$^5$ .................. H03K 17/56; H03K 19/173
[52] U.S. Cl. .................. 307/465; 307/243; 340/825.22
[58] Field of Search .............. 307/465–469, 307/243; 340/825.83, 825.22

[56] References Cited

U.S. PATENT DOCUMENTS

| | | | |
|---|---|---|---|
| 4,675,808 | 6/1987 | Grinn | 364/200 |
| 4,677,592 | 6/1987 | Sakurai | 365/222 |
| 4,761,647 | 8/1988 | Hallenbeck | 340/825.22 |
| 4,800,529 | 1/1989 | Ueno | 365/189 |
| 4,906,870 | 3/1990 | Gongwer | 307/465 |
| 5,019,736 | 5/1991 | Furtek | 307/465 |
| 5,055,718 | 10/1991 | Galbraith | 307/243 |
| 5,122,685 | 6/1992 | Chan et al. | 307/465 |

Primary Examiner—David R. Hudspeth
Assistant Examiner—Andrew Sanders
Attorney, Agent, or Firm—Raymond J. Warren; Walter W. Nielsen

[57] ABSTRACT

A programmable logic device having four AND gate means defined therein is used to combine first and second inputs as well as multiplexing and latch signals. These signals are ANDed together (first input and multiplexing signals; inverted multiplexing signal and latch signal and second input; inverted multiplexing signal, second input signal and device output signal; and inverted latch signal and device output signal) to provide four output signals which are ORed together to produce the device output signal.

3 Claims, 2 Drawing Sheets

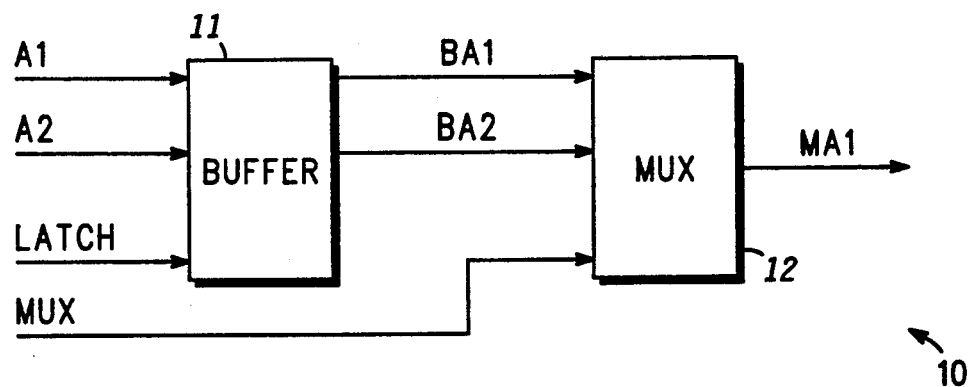
FIG. 1
-PRIOR ART-
FIG. 2
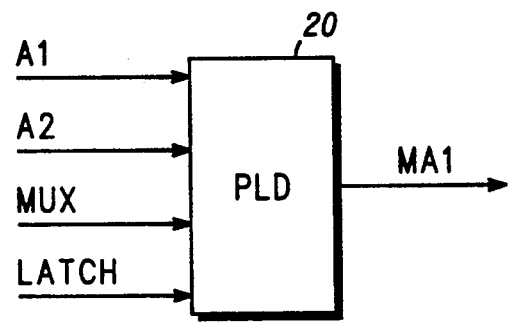
FIG. 3
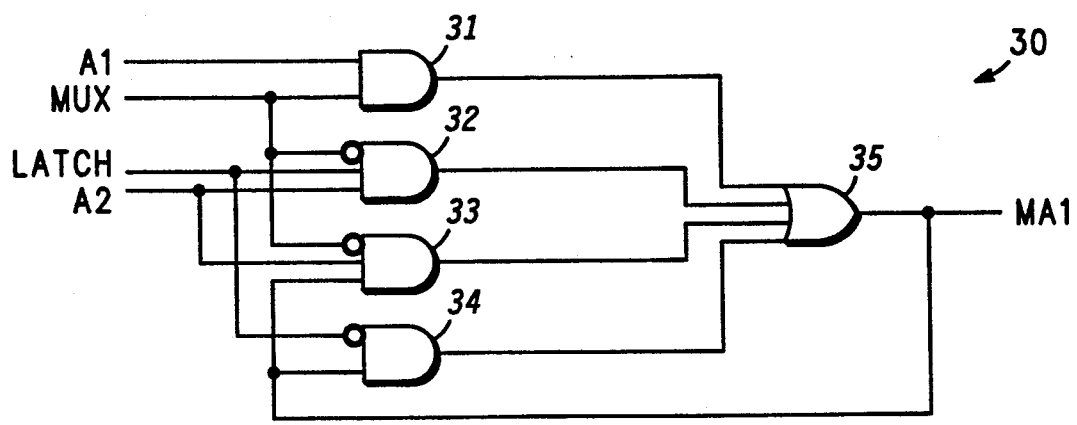

PROGRAMMABLE LOGIC DEVICE ADDRESS BUFFER/MULTIPLEXER/DRIVER

BACKGROUND OF THE INVENTION

The present invention relates, in general, to a programmable logic device (PLD) and, more particularly, to a combination address buffer/multiplexer/driver implemented in a programmable logic device.

Present techniques for multiplexing addresses to a memory device, such as a dynamic random access memory (DRAM) or the like, consists of two levels of logic. In the first level, an address is latched into a buffer. In the second level, the address is multiplexed prior to being provided to the memory. This implementation results in two levels of delays and requires that separate board real estate space be provided for both circuits.

Therefore, a need exists for a faster means of processing the address signals in an implementation which will require less board space.

Accordingly, it is an object of the present invention to provide an address buffer, multiplexer, and driver which is implemented in one level of logic thereby eliminating one of the levels of delay.

It is another object of the present invention to provide an address buffer, multiplexer, and driver which is implemented in a single device requiring less board space.

SUMMARY OF THE INVENTION

A particular embodiment of the present invention comprises a programmable logic device having four AND gate means defined therein. The four gate means receive first and second inputs as well as multiplexing and latch signals. These signals are then ANDed as follows to provide four output signals: first input and multiplexing signals; inverted multiplexing, latch, and second input signals; inverted multiplexing, second input, and device output signals; and inverted latch and device output signals. The outputs from these ANDed combinations are the ORed together to produce the device output signal.

BRIEF DESCRIPTION OF THE DRAWINGS

FIG. 1 is a block diagram of a prior art address buffer, multiplexer, and driver;

FIG. 2 is a block diagram of an address buffer, multiplexer, and driver embodying the present invention;

FIG. 3 is a logic diagram of the address buffer, multiplexer, and driver of FIG. 2.

DETAILED DESCRIPTION OF THE DRAWINGS

Figure 4:
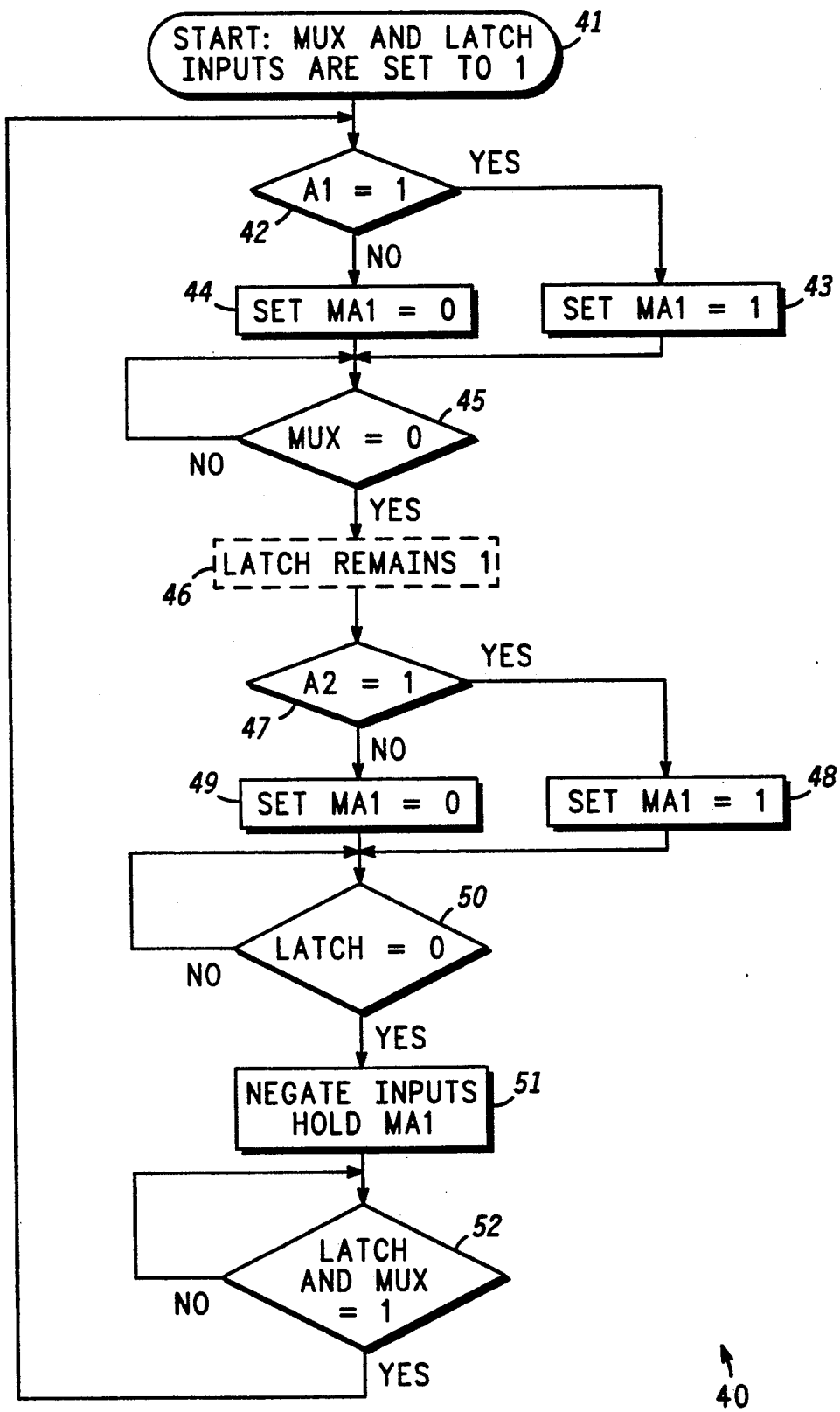
FIG. 4 is a flow chart representing a method of operation of a programmable logic device embodying the present invention.

Referring initially to FIG. 1, a block diagram, generally designated 10, of a prior art address buffer, multiplexer, and driver circuit is illustrated. Circuit 10 consists of two devices: a buffer 11 for latching and temporarily storing inputs; and a multiplexer 12 for multiplexing inputs from buffer 11.

In operation, an address will be provided to buffer 11 along lines A1-A2. When a signal (LATCH) is received along the latch line, buffer 11 will accept and store the A1-A2 inputs. This data will then be provided at the buffered outputs BA1-BA2.

A select (MUX) input will then be provided to multiplexer 12 directing it to pass one of the BA1-BA2 inputs and provide this data as the output MA1.

Therefore, there are two delays built into this system. The first delay is caused in buffer 11 in the time needed to store the address signals. The second delay results from the multiplexer making the data selection as indicated by the select signal.

In a preferred embodiment, a Programmable Logic Device (PLD), such as a Programmable Array Logic (PAL), is used to implement the above device. This PLD, generally designated 20 is illustrated in block form in FIG. 2. Device 20 receives the same inputs as circuit 10 and provides the same output. Therefore, device 20 is compatible with existing circuitry and may be used to replace circuit 10 directly. However, since device 20 is implemented in one device, the physical board space required for device 20 is less than half of that required for circuit 10.

PLD 20 is designed based upon the algorithm shown in Table 1.

TABLE 1

| |
| --- |
| MA1 = MUX & A1 # |
| !MUX & LATCH & A2 # |
| MA1 & A2 & !MUX # |
| !LATCH & MA1 |

In the first line of the algorithm, a MUX signal is logically ANDed (&) with the A1 signal. In the second line, an inverted MUX signal (!MUX) is ANDed with the LATCH and A2 signals. In the third line, the MA1 output signal is ANDed with the A2 and !MUX signal. In the fourth line, the !LATCH signal is ANDed with the MA1 signal. The outcomes of these four lines are then ORed (#) together to produce the MA1 output.

A physical representation of this is illustrated in the logic circuit, generally designated 30, of FIG. 3. Circuit 30 consists of four AND gates 31-34 and an OR gate 35. Gate 31 receives the A1 and MUX inputs and provides an ANDed output signal to gate 35. Gate 32 receives the !MUX, LATCH, and A2 inputs and provides an ANDed output signal to gate 35. Gate 33 receives the !MUX, A2, and feedback MA1 signals and provides an ANDed output signal to gate 35. Gate 34 receives the !LATCH and MA1 signals and provides an ANDed output signal to gate 35. Finally, gate 35 ORs the inputs from gates 31-34 together to produce the MA1 output.

In this configuration, MA1 will follow the A1 input when MUX and LATCH are high. The MA1 output will follow the A2 input when MUX is low and LATCH is high. Finally, the MA1 output is latched to the current output when both MUX and LATCH are low.

A fourth unused state is provided, where MUX is high and LATCH is low. This is included to provide a clean transition from the A2 following state to the latched-up (MA1) state. These states are summarized in Table 2.

TABLE 2

| MUX | LATCH | OUTPUT (MA1) |
| --- | --- | --- |
| 1 | 1 | A1 |
| 0 | 1 | A2 |
| 1 | 0 | (UNUSED) |
| 0 | 0 | MA1 |

Referring now to FIG. 4, a flow chart, generally designated 40, representing the operation of a programmable logic device embodying the present invention is shown. The process enters at start block 41. At this time both of the MUX and LATCH inputs are set high.

Process 40 then moves to decision step 42 where it is determined if the A1 state is high. If A1 is equal to 1, then MA1 is set to 1, block 43. If A1 is equal to 0, then MA1 is set to 0, block 44.

Following blocks 43 or 44 is a decision block 45. The process remains at this point until the MUX input changes from a 1 to a 0. Following decision block 45 is a block 46 shown in outlined form. Block 46 is shown in outlined form since it is not a part of the process. It is provided to show that the LATCH input has remained high during the previous processing.

Next, is a decision block 47 where process 40 determines if A2 is equal to 1. If A2 is equal to 1, then MA1 is set to 1, block 48. If A2 is equal to 0, then MA1 is set to 0, block 49.

Following blocks 48 or 49 is a decision block 50. In block 50, it is determined if LATCH is equal to 0. Process 40 will continue looping through block 50 until the LATCH is equal to 0. Process 40 will then continue to block 51. At this point, all of the inputs are negated and the output is held (latched).

Process 40 then moves to decision block 52 where it continues to cycle until both MUX and LATCH inputs are set equal to 1. Once this condition occurs, process 40 loops back to decision block 42.

Thus, it will be apparent to one skilled in the art that there has been provided in accordance with the invention, a means that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A combination buffer and multiplexer device having a first, second, multiplexing, and latch inputs and a device output, said device comprising:

first means for combining said first input and said multiplexing input in a logical AND fashion to provide a first output;

second means for combining said second input, said latch input, and an inverted multiplexing input in a logical AND fashion to provide a second output;

third means for combining said inverted multiplexing input, said second input, and said device output in a logical AND fashion to provide a third output;

fourth means for combining an inverted latch signal and said device output in a logical AND fashion to provide a fourth output; and fifth means for combining said first, second, third, and fourth outputs in a logical OR fashion to provide said device output.

2. A programmable logic device for providing a multiplexed output, said device having a first, second, multiplexing, and latch inputs and a device output, said device comprising:

first means for combining said first input and said multiplexing input in a logical AND fashion to provide a first output;

second means for combining said second input, said latch input, and an inverted multiplexing input in a logical AND fashion to provide a second output;

third means for combining said inverted multiplexing input, said second input, and said device output in a logical and fashion to provide a second output;

fourth means for combining an inverted latch signal and said device output in a logical AND fashion to provide a fourth output; and fifth means for combining said first, second, third, and fourth outputs in a logical OR fashion to provide said device output.

3. A method of operating a programmable logic device as a combination buffer and multiplexer comprising the steps of:

a) receiving a first input, a second input, a multiplexer input, and a latch input wherein said multiplexer and latch inputs are in a logically first state;

b) setting an output of said device to said logical first state if said first input is in said first state, otherwise setting said output of said device to a logical second state;

c) waiting for said multiplexer input to change to said logical second state;

d) setting an output of said device to said logical first state if said second input is in said logical first state, otherwise setting said output of said device to said logical second state;

e) waiting for said latch input to change to said logical second state;

f) latching said output to a present logical state following step e; and g) returning to step b if said multiplexer and latch inputs return to said logical first states.

* * * * *

UNITED STATES PATENT AND TRADEMARK OFFICE
CERTIFICATE OF CORRECTION

PATENT NO. : 5,185,539

DATED : February 9, 1993

INVENTOR(S) : Janet M. Snyder, et al

It is certified that error appears in the above-indentified patent and that said Letters Patent is hereby corrected as shown below:

Column 4, line 22, delete "and" and insert --AND-- and delete "second" and insert --third--.

Signed and Sealed this

Seventeenth Day of May, 1994

Attest:

BRUCE LEHMAN

Attesting Officer    Commissioner of Patents and Trademarks